US006541893B2

(12) United States Patent
Zhu et al.

(10) Patent No.: US 6,541,893 B2
(45) Date of Patent: Apr. 1, 2003

(54) PROGRAMMABLE SURFACE ACOUSTIC WAVE (SAW) FILTER

(75) Inventors: Jiahua Zhu, Somerville, NJ (US); Yicheng Lu, East Brunswick, NJ (US); John Kosinski, Wall Township, NJ (US); Robert Pastore, Freehold, NJ (US)

(73) Assignee: Rutgers, The State University of New Jersey, Pistcataway, NJ (US)

( * ) Notice: Subject to any disclaimer, the term of this patent is extended or adjusted under 35 U.S.C. 154(b) by 0 days.

(21) Appl. No.: 09/873,499

(22) Filed: Jun. 4, 2001

(65) Prior Publication Data
US 2002/0047494 A1 Apr. 25, 2002

Related U.S. Application Data
(60) Provisional application No. 60/179,735, filed on Feb. 2, 2000.

(51) Int. Cl.[7] .................................................. H03H 9/25
(52) U.S. Cl. ............................. 310/313 B; 310/313 C
(58) Field of Search .......................... 310/313 B, 313 C, 310/317

(56) References Cited

U.S. PATENT DOCUMENTS

| 3,750,027 A | | 7/1973 | Hartmann ................... 325/349 |
| 3,831,116 A | | 8/1974 | Davis, Jr. et al. ............. 333/72 |
| 3,882,433 A | * | 5/1975 | Subramanian .......... 310/313 B |
| 3,965,444 A | * | 6/1976 | Willingham ............... 330/30 R |
| 4,477,828 A | * | 10/1984 | Scherer ....................... 257/687 |
| 4,546,283 A | * | 10/1985 | Adamo et al. ........... 310/313 R |
| 4,640,746 A | * | 2/1987 | Nobel et al. ................. 205/118 |
| 4,845,397 A | | 7/1989 | Herrick et al. ............... 310/348 |
| 4,870,312 A | * | 9/1989 | La Rosa et al. ........ 310/313 B |
| 5,235,235 A | * | 8/1993 | Martin et al. ........... 310/313 B |
| 5,256,927 A | * | 10/1993 | Kato et al. ............... 310/313 B |
| 5,973,578 A | | 10/1999 | Zharov et al. ............... 333/166 |
| 6,023,122 A | | 2/2000 | Liu et al. ................. 310/313 B |
| 6,037,847 A | | 3/2000 | Ueda et al. .................. 333/193 |
| 6,049,155 A | | 4/2000 | Graebner et al. ........ 310/313 R |
| 6,057,630 A | | 5/2000 | Yanagihara et al. .... 310/313 R |
| 6,057,744 A | | 5/2000 | Ikada .......................... 333/133 |
| 6,060,960 A | | 5/2000 | Tanaka et al. ............... 333/104 |
| 6,075,426 A | | 6/2000 | Tsutsumi et al. ........... 333/193 |
| 6,081,599 A | | 6/2000 | Zinevitch .................... 380/210 |
| 6,144,288 A | * | 11/2000 | Jahn et al. ................ 340/10.33 |
| 2002/0017969 A1 | * | 2/2002 | Takamine .................... 333/193 |
| 2002/0021195 A1 | * | 2/2002 | Takamine .................... 333/195 |

FOREIGN PATENT DOCUMENTS

JP          7-226643     *   8/1995    .......... H03H/9/145

OTHER PUBLICATIONS

"Surface Acoustic Waves and SAW Devices," Fagerholm, et al., Dec. 1995.
"General SAW", Phonon Corporation, Dec. 1996.
"Resonator Type SAW Filter", Tagami, et al. Oki Technical Review, Dec. 1999.

* cited by examiner

Primary Examiner—Thomas M. Dougherty
(74) Attorney, Agent, or Firm—Hoffmann & Baron, LLP

(57) ABSTRACT

A novel programmable SAW filter with switchable multi-element interdigital transducers (IDTs) controlled by a microprocessor or a computer is provided that realizes the tunability of both center frequency and bandwidth of the SAW filter. The filter possesses the feature of the programmability of both center frequency and 3 dB bandwidth. As an example design, the center frequency of the SAW filter ranges from 126.8 MHz to 199.1 MHz while the 3 dB bandwidth ranges from 18.8 MHz to 58.9 MHz. The multi-input configuration increases the programmability of the device and improves insertion loss. A matching network for the programmable SAW filter further improves insertion loss level and stopband attenuation. A resistance weighting method has been applied to improve in band ripple with the passband ripple being reduced from 6.44 dB to 1.37 dB after resistance weighting. The prototype of programmable SAW filter simplifies the device structure and fabrication process by eliminating the tap weighting and summing circuits, resulting in a smaller device and lower costs. Moreover, frequency response shaping is realized without apodization.

20 Claims, 12 Drawing Sheets

PROGRAMMABLE SURFACE ACOUSTIC WAVE (SAW) FILTER

CROSS REFERENCE TO RELATED APPLICATIONS

This application claims priority to International Application No. PCT/US01/40006, filed on Feb. 1, 2001, and which designated the U.S., and claims the benefit of U.S. Provisional Application No. 60/179,735, filed on Feb. 2, 2000.

STATEMENT REGARDING FEDERALLY SPONSORED RESEARCH OR DEVELOPMENT

The invention herein was sponsored, in part, by the U.S. Government, under contract with the U.S. Army CECOM, number DAAB 07-96-R-J8107 (Rutgers, 4-26537).

FIELD OF THE INVENTION

The present invention is directed to a piezoelectric programmable surface acoustic wave (SAW) filter and a method of use thereof. In particular, the present invention provides a multi-interdigital transducer (IDT) input tunable SAW filter with selectable center frequency and 3 dB bandwidth features.

BACKGROUND OF THE INVENTION

Surface acoustic wave (SAW) devices are an important class of piezoelectric devices, providing frequency control, frequency selection, and signal processing capabilities. SAW devices have many diverse applications, with the various types of SAW devices including filters, resonators, delay lines, correlators and the like.

SAW filters, in particular, play a key role in telecommunications. They have been widely used as bandpass and spectrum-shaping filters in mobile and wireless applications. Other applications for SAW filters currently available include wide area network(WAN), wireless local area network(WLAiN) communications, cordless phones, pagers and satellite communications. Linear phase SAW filters are used in communications circuits when distortion of the processed signal is to be avoided. SAW filters are preferable to conventional LC filters as they are much smaller, cheaper and more versatile, making them ideal for telecommunication applications.

Coupling between surface waves and electrical signals is usually achieved by interdigital transducers (IDTs). One simple form of the IDT consists of many parallel fingers alternately connected to opposite electrodes to which the signal is applied. The wavelength of the generated elastic wave is equal to the transducer periodicity p, defined as the center distance between two consecutive fingers of one comb of the IDT. Shown in FIG. 1 is the geometry of an interdigital transducer 10. The finger period P equals one wavelength of the surface acoustic wave. It is divided into two fingers and two spacings with the same width of quarter wavelength. The overlaps W of the fingers are all the same. The length L of the IDTs is defined as (N×P)/2 where N is the number of overlap.

The basic structure of a SAW filter consists of one input and one output interdigital transducers deposited on a piezoelectric substrate. These IDTs function as a transmitter and receiver for the surface acoustic waves. When an AC voltage is applied to input transducers, due to piezoelectricity the transducer produces mechanical deformation of the piezoelectric substrate surface. The reason for this is the electric field between two opposite transducer fingers of different polarity. The surface acoustic wave travels on the surface until reaching the output IDT where it is transformed back to electrical signal. Shown in FIG. 2 is a schematic diagram of the basic design of a SAW filter 20 with constant finger overlap W and uniform finger spacing. When an AC voltage is applied to the input IDT, it will cause strain, and thus cause the lattice to vibrate. The input IDT converts signal voltage variations into mechanical surface acoustic waves. $V_{in}$ is the equivalent input voltage and $V_L$ is the load voltage. R and $R_L$ are the SAW filter's source resistance and load resistance, respectively. The acoustic wave will propagate along the surface, polarizing the lattice cells, generating an electric field. When this wave reaches the output IDT the electric field will induce a potential difference between neighboring electrodes. The output IDT is employed as a receiver to convert mechanical SAW vibration back into output voltages. For a signal to be transmitted, the change must be continuous. That means only alternating current signals can be transmitted. Therefore SAW filters are always bandpass, or bandstop filters.

SAW filters can be designed to provide quite complex signal processing functions within a single package containing only a piezoelectric substrate with superimposed thin metal film input and output interdigital transducers (IDTs). SAW filters can be mass-produced using semiconductor microfabrication techniques, which enables the outstanding reproducibility of the SAW filters. SAW filters are often implemented in small, rugged, light and power efficient modules, making them more attractive to the other competing technology, such as lumped RLC filters, ceramic block filters, multi-layer ceramic filters and other microwave filters. SAW filters can operate as a bandpass, bandreject, adaptable or matched filter. Such versatility makes SAW filters ideal for mobile and wireless communications.

A SAW IDT, as shown in FIGS. 1 and 2, is a bi-directional device; that is, the acoustic wave will propagate in both directions of the propagation axis. This will cause an inherent 3 dB loss for the power transmitted. At the output, for maximum power transfer, the IDT and load impedance must be matched, resulting in another 3 dB loss. Therefore a SAW filter as presented above has an inherent 6 dB insertion loss. Other loss mechanisms also exist, including mechanical losses due to crystal defects in the acoustic wave medium and diffraction of the wave.

Thus, communication receivers are often faced with the problem of trying to receive a weak signal in the presence of strong interfering signals. Even if the receiver have the sufficient sensibility to receive the weak signal, the receiver will be desensitized to a level determined by the strength of the largest interfering signal and the dynamic range of the receiver. Selective front-end filtering, which this programmable SAW filter provides, is strongly preferred and recommended in such situations.

Current programmable SAW filters are often large, complex and costly compared to regular SAW filters. Moreover, the relatively high insertion loss prevents their usage in many insertion loss sensitive applications. It is therefore desirable to design and fabricate a simple, small, inexpensive and low insertion loss programmable SAW filter for implementation in adaptive communication systems, radar systems and similar applications. Programmability of the SAW filters is highly desirable in such fields so as to optimize the receiver's sensitivity and allow for adaptive signal processing.

SUMMARY OF THE INVENTION

The present invention employs a multi-element input interdigital transducer (IDT) SAW filter having an improved insertion loss level wherein the addition of resistance weighting to the multi-element IDT improved the passband ripple. The present invention can be used in both commercial and military applications such as wideband radar and communication systems employing adaptive filter techniques. It can also be used in spread spectrum communication systems or frequency hopping systems as an adaptive pre-filter to remove interference. It can be integrated into ASIC designs for many communication and wireless applications.

The programmable SAW filter of the present invention is fabricated on 128° rotated Y-cut lithium niobate(LiNbO$_3$). The device preferably consists of 11 constant overlap interdigital transducers (IDT) in the propagation path. The IDTs' center frequencies are designed to be 124.8 MHz, 166.3 MHz and 199.6 MHz, respectively. The transducers are composed of quarter wavelength electrodes with different electrode widths and have the same aperture of 2400 $\mu$m. Switchable single-IDT input and multi-IDT input SAW filter configurations are contemplated. The changes between different SAW filter configurations are implemented by computer controlled RF switches.

The programmable SAW filter described herein has both center frequency and bandwidth tunability. The center frequency produced by the programmable SAW filter ranges from 126.8 MHz to 199.1 MHz while the 3 dB bandwidth ranges from 18.8 MHz to 58.9 MHz. The lowest insertion loss of 9.5 dB is achieved. In comparison with the single-IDT input SAW filter configuration, the multi-input filter configuration offers lower insertion loss by taking advantage of the constructive interference of the surface waves. Matching network for the programmable SAW filter has been developed to improve insertion loss level and stopband attenuation. Resistance weighting was implemented and the results showed improved passband response.

It is therefore an advantage of the present invention to provide a programmable SAW filter with switchable input and output IDT. The programmable feature of this device will enable it to be applied as an adaptive filter in the fields of wireless, radar and satellite communications and the like.

It is another advantage of the present invention to provide a programmable SAW filter without complex tap weighting and summing circuits. The programmable SAW filter of the present invention simplifies the device structure and fabrication process by eliminating conventional tap-weighting and summing circuits, significantly simplifying the device structure complexity, and reducing both the size and cost of a programmable SAW device.

It is an additional advantage of the present invention to realize frequency response shaping without apodization.

It is yet another advantage of the present invention to easily realize a multi-IDT input configuration that offers enhanced tunability and filter performance.

DETAILED DESCRIPTION OF THE PREFERRED EMBODIMENTS

Figure 1:
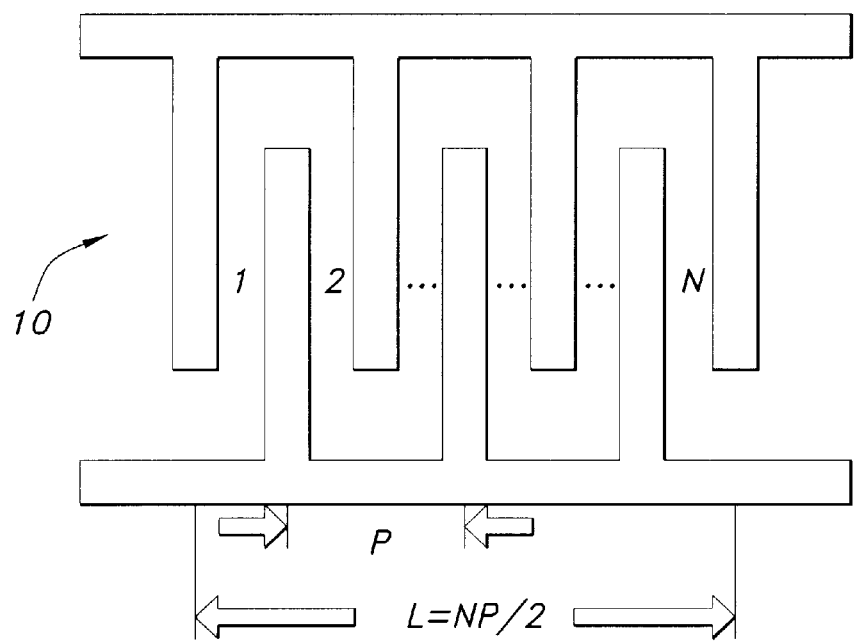
FIG. 1 is a schematic diagram of the geometry of a conventional surface acoustic wave interdigital transducer.
Figure 2:
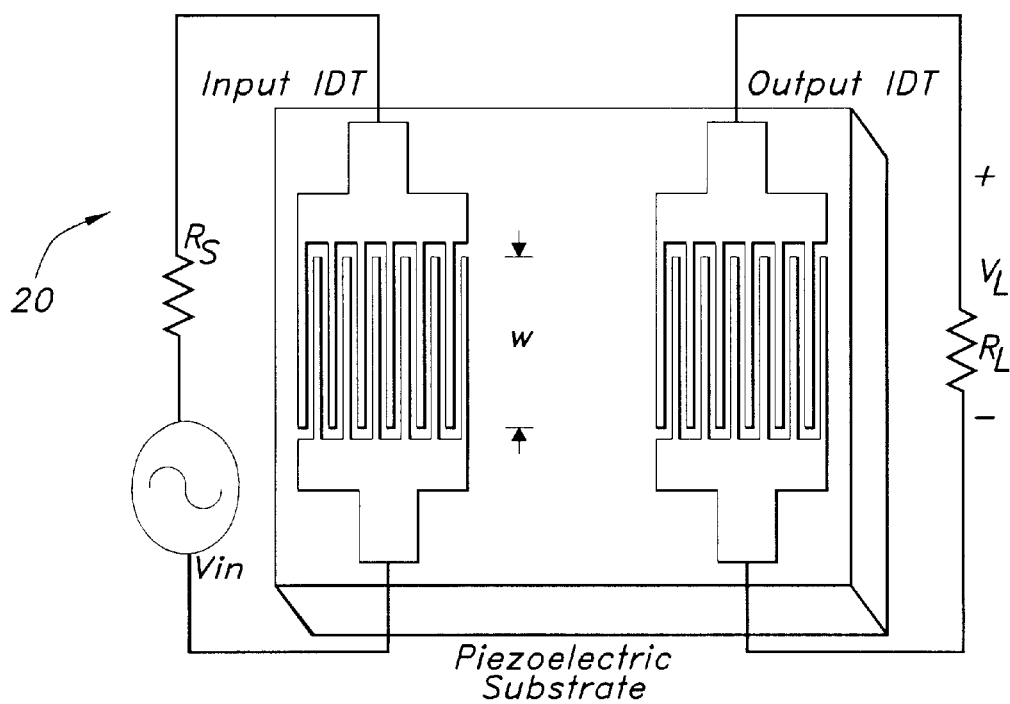
FIG. 2 is a schematic diagram of a conventional SAW filter.
Figure 3:
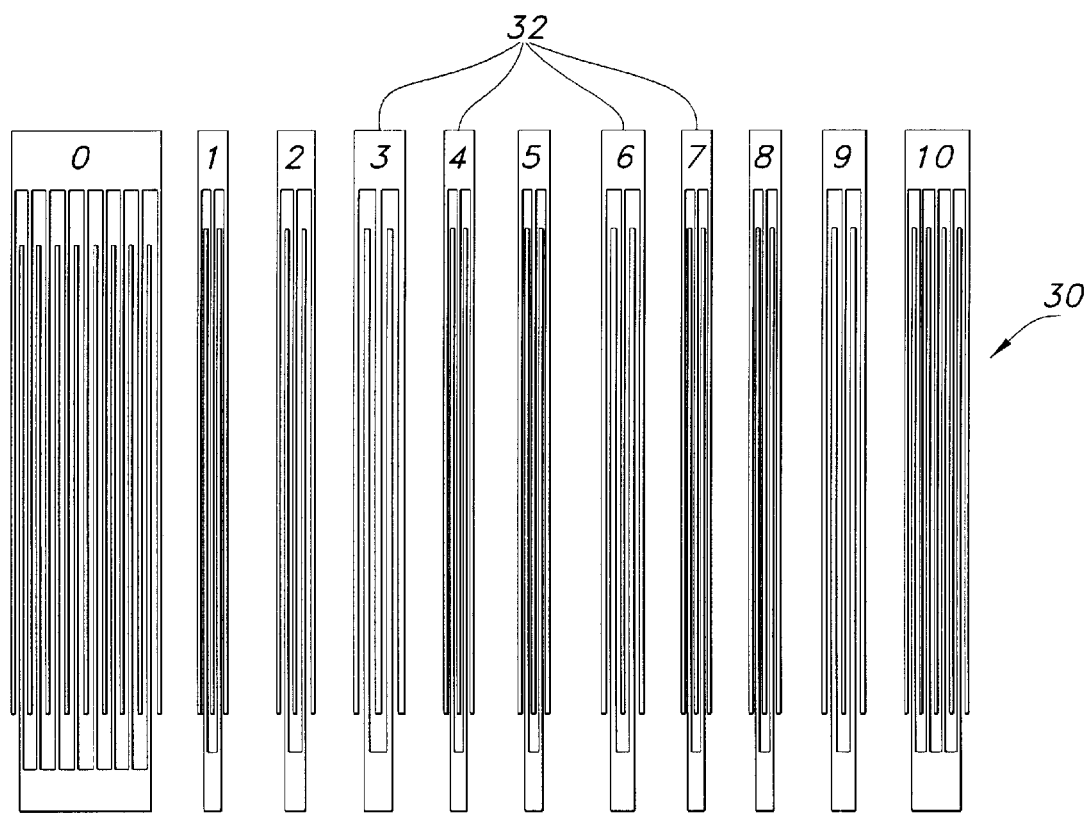
FIG. 3 is a schematic diagram of a programmable SAW filter in accordance with one form of the present invention.

Now referring to the figures, in which like elements have identical reference numbers, and referring specifically to FIG. 3, a tunable SAW filter 30 is built on 128° rotated Y-cut lithium niobate (LiNbO$_3$) substrates with a surface acoustic velocity of 3992 m/s and a coupling coefficient K$^2$=5.3%. It includes, in the preferred arrangement, 11 IDTs 32 parallel in the propagation path. The transducers are composed of quarter wavelength electrodes with different widths but the same aperture of 2400 $\mu$m (micron). IDTs 1,4 and 7 have electrode width of 5 $\mu$m corresponding to center frequency of 199.6 MHz. IDTs 0,2,5,8 and 10 have electrode width of 6 $\mu$m corresponding to center frequency of 166.3 MHz. IDTs 3,6 and 9 have electrode width of 8 $\mu$m corresponding to center frequency of 124.8 MHz.

Five different IDT structures are used for the 11 IDTs such that their transfer functions are different. Choosing one of the 11 IDT as an input IDT and another one as an output IDT, a SAW filter is formed. By simply changing the input and output IDT, another SAW filter with different transfer function can be configured. Switching between different filter configuration options are realized by computer controlled RF switches. Moreover, a SAW filter with more than one input IDT will offer more tunability for the programmable SAW filter.

Figure 4:
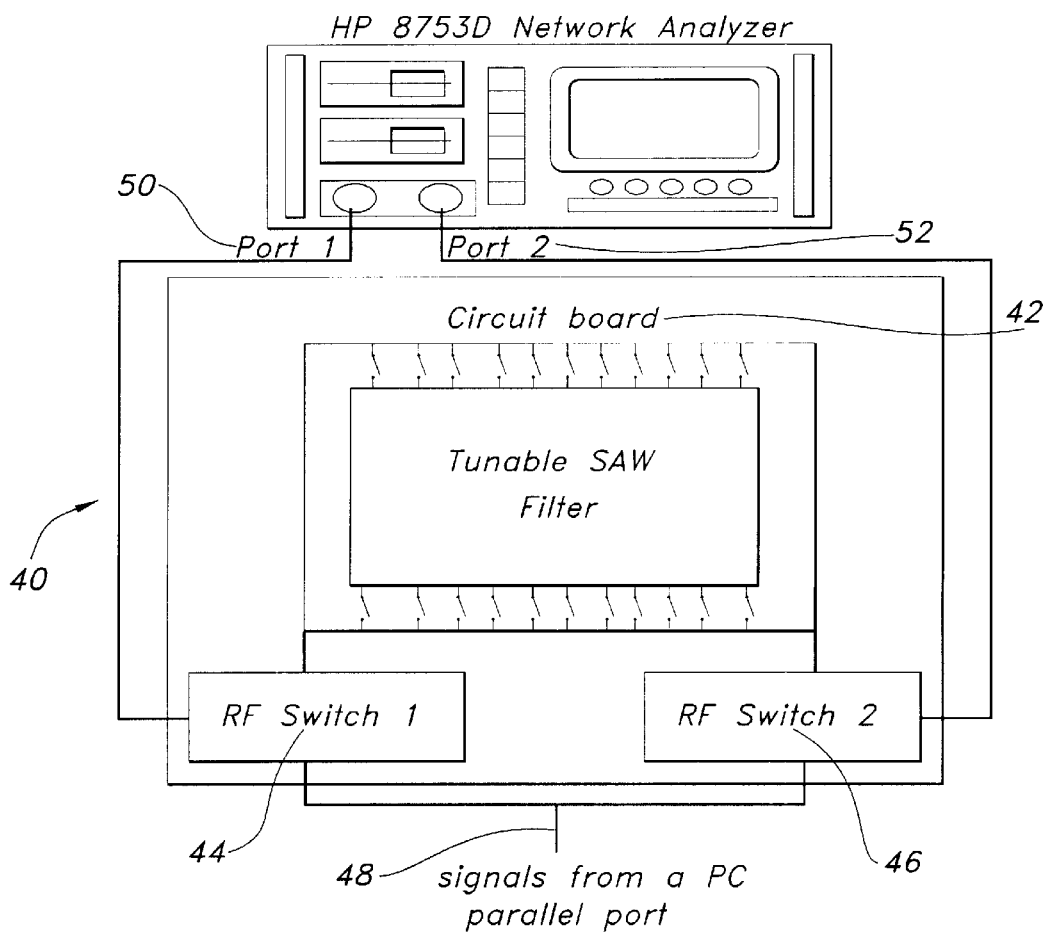
FIG. 4 is a schematic diagram of a test setup for the programmable SAW filter of FIG. 3.

Referring further to FIG. 4, a schematic diagram of a tunable SAW filter test setup is illustrated. A circuit board 42 consisting of two RF switches 44,46 is designed for electronically selecting the input and output IDT of the SAW filter. Signals coming from a PC parallel port 48 drive the RF switches which are connected to the SAW filter. A suitable computer program may be used to realize the appropriate SAW filter configurations. After selecting the input and output IDT, the program activates the proper output pins of the parallel port. This in turn activates the appropriate output pin of the RF switches which route the signal from the network analyzer Port 1 (50) to the pins of the designated input IDT. The signal then causes the input IDT to be excited to create the surface wave. The output IDT activated by another RF switch receives this wave, and the signal is routed to Port 2 (52) of the network analyzer where the response is measured. Rapid switching from one filter configuration to another is possible by changing the program parameters.

Figure 5:
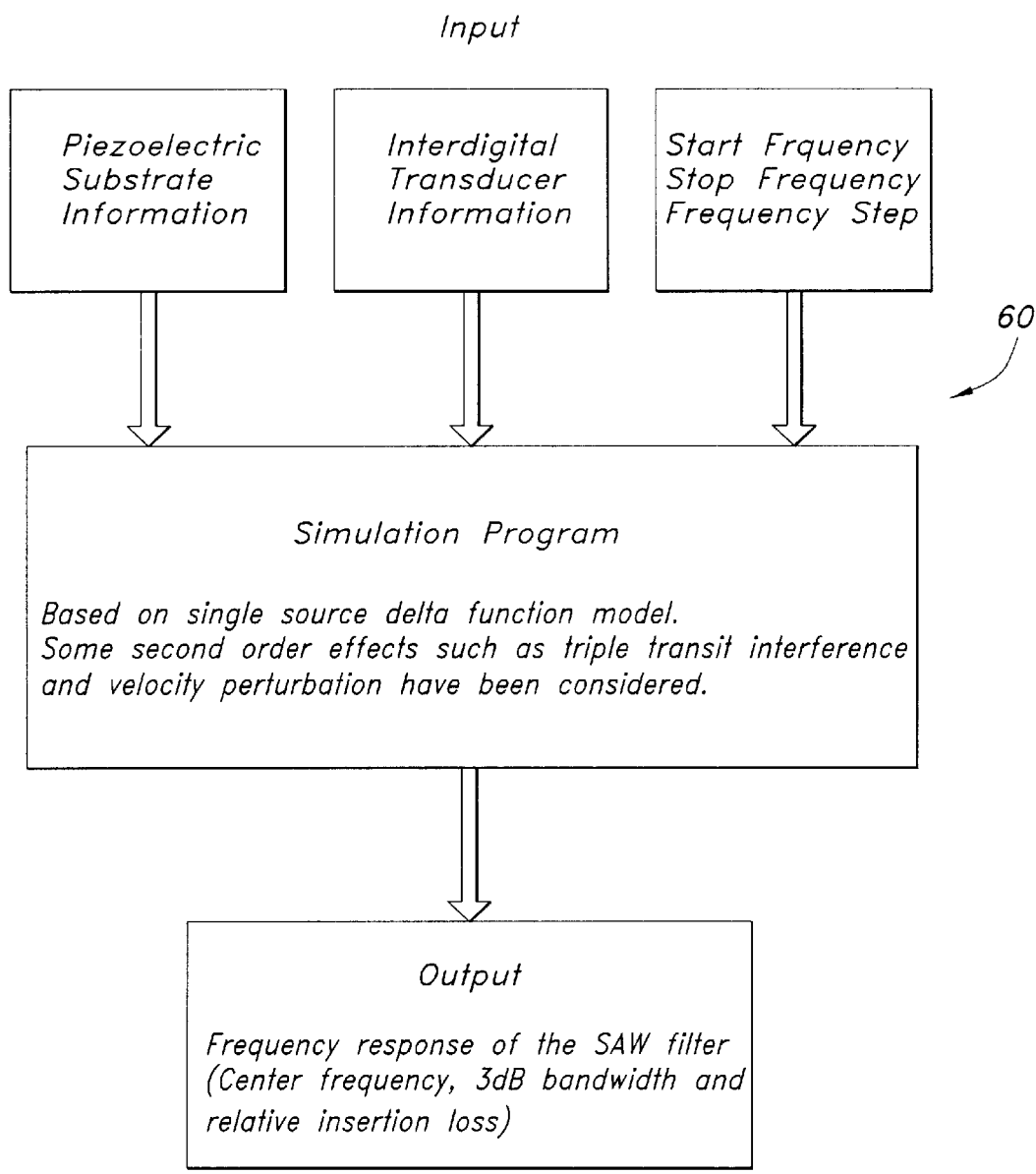
FIG. 5 is a schematic diagram of a simulation program flow chart.

The simulation program in conjunction with the present invention SAW filter requires input and output IDT apodization files, piezoelectric substrate and frequency sweep information files to run. The IDT apodization files contain the number of electrodes of the input and output IDT, SAW wavelength and apodization information. The input files are all in text format which can be easily written and revised. The program calculates input and output IDT transfer functions to derive an overall transfer function. The flow chart of the simulation program 60 is shown in FIG. 5. A single delta function source model based SAW frequency spectrum simulator has been developed. Some of the second order effects, such as triple transit interference, velocity perturbation and surface wave attenuation due to materials have been included in the simulation program.

Figure 6:
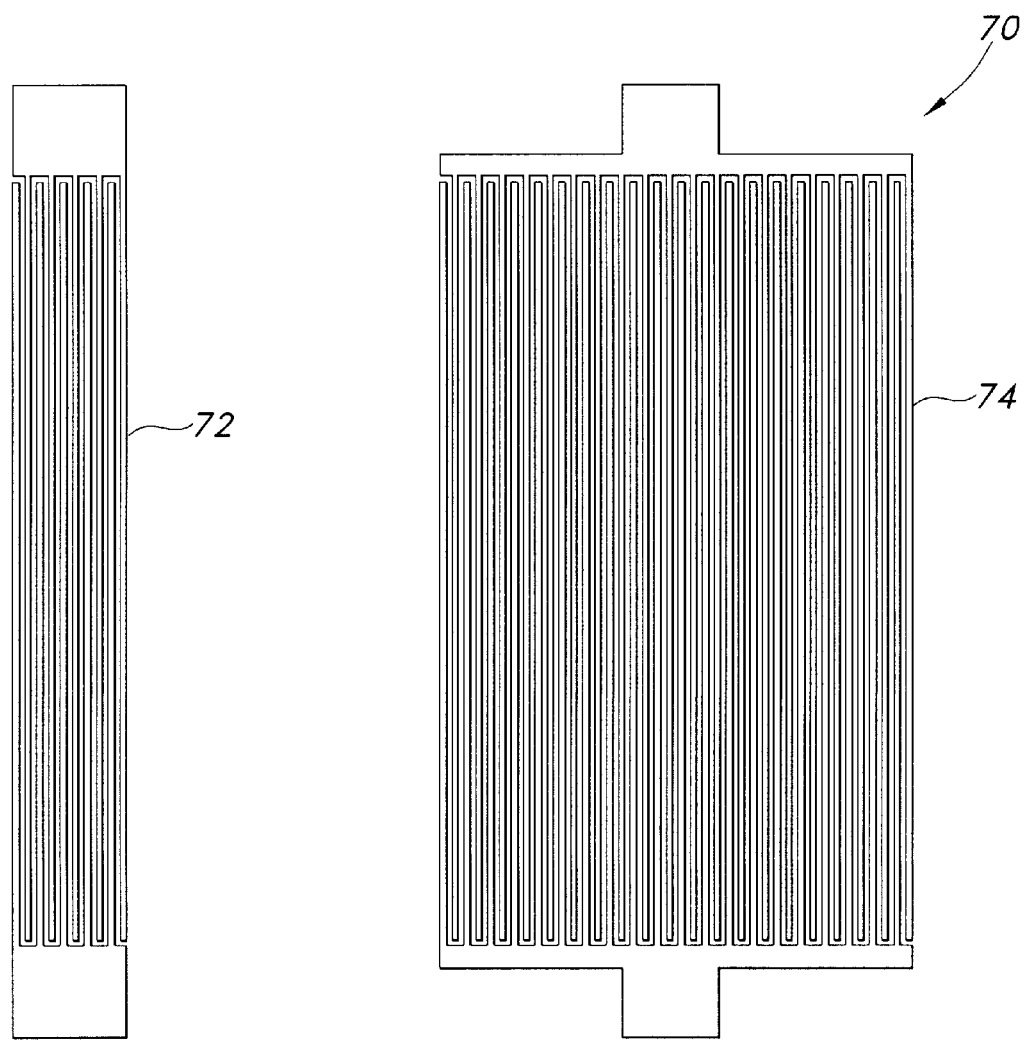
FIG. 6 is a schematic diagram of a reference SAW filter.

To establish the utility of the simulation program, a reference SAW filter was designed and fabricated on 128° rotated, X-propagating orientation of $LiNbO_3$. The schematic of the reference SAW filter 70 is shown in FIG. 6. The reference SAW filter 70 has unapodized input and output IDT with uniform finger overlap. Both input and output IDT have quarter $\lambda$ electrode width of 5 $\mu$m and quarter $\lambda$ electrode spacing. Therefore, the corresponding wavelength of the excited surface acoustic wave is 20 $\mu$m. The input IDT 72 has 10 electrodes while the output IDT 74 has 40 electrodes. In order to perform the on-wafer measurements using the probe with a tip to tip dimension of 750 $\mu$m, the IDT's electrode length and the bonding pad to bonding pad distance are designed as 675 $\mu$m and 840 $\mu$m, respectively.

Figure 7:
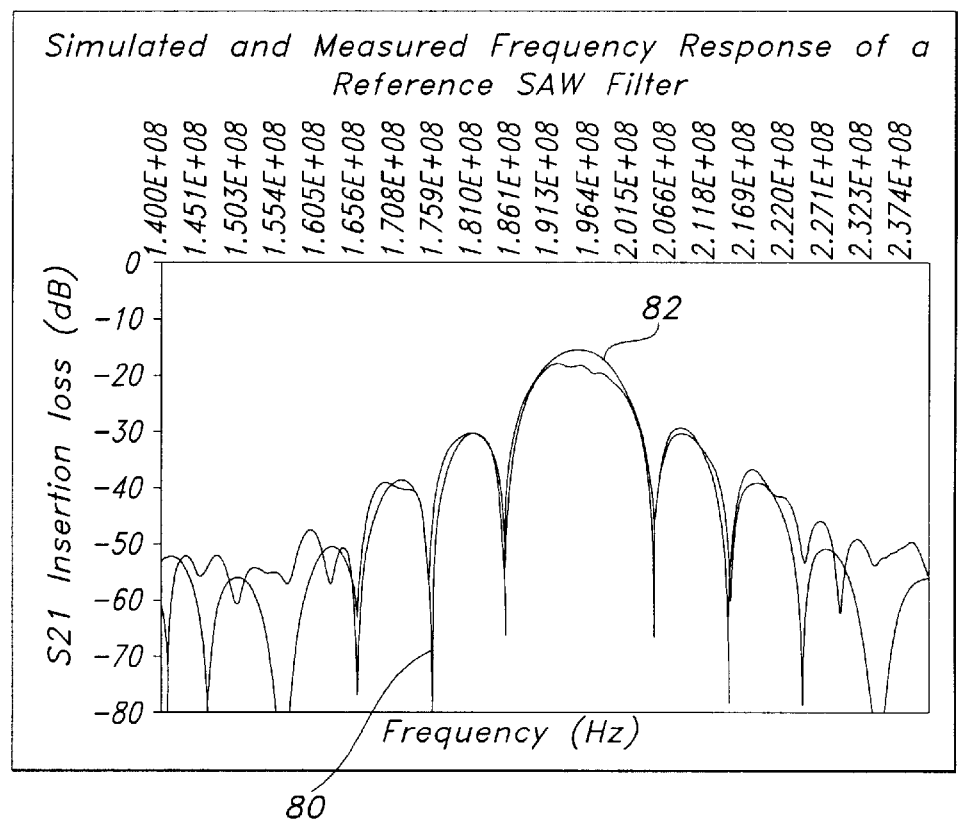
FIG. 7 is a diagram of a simulated and measured frequency response of a reference SAW filter of FIG. 6.
Figure 8:
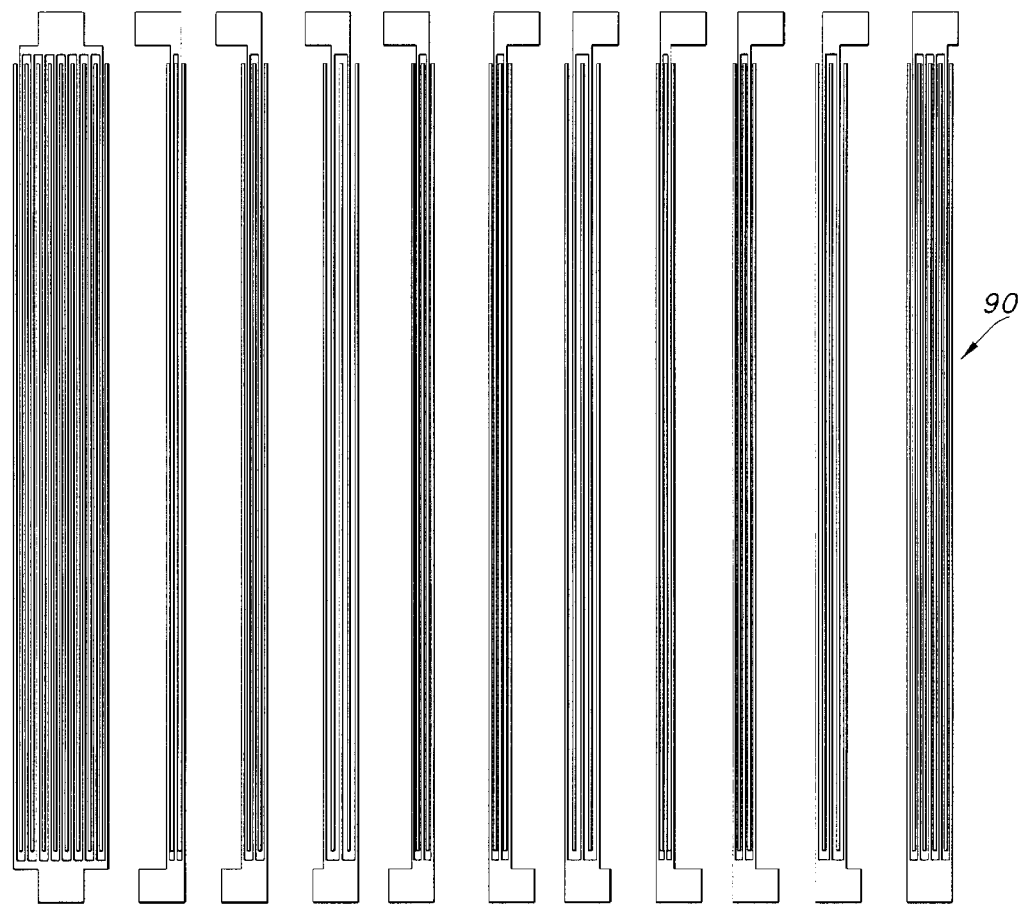
FIG. 8 is a photograph of a SAW metallization pattern on a lithium niobate substrate.

The simulation and measurement data for this reference device fabricated on $LiNbO_3$ are shown in FIG. 7. The dashed line 80 represents the simulation result and the solid line 82 represents the measurement results. It is noted that the simulation results closely approximates the measurement results in main lobe and the two nearest sidelobes. The unperturbed SAW velocity for 128° rotated, X-propagating orientation of $LiNbO_3$ is 3992 m/s. However, the actual mass of the metal electrodes will dampen the surface acoustic wave. This can be reduced somewhat by using thin electrodes of a light metal, therefore aluminum is preferable to gold in the fabrication of most SAW IDTs. Ideally, the electrode films should be as thin as possible. A photo picture 90 of a programmable SAW filter with patterned metallization on $LiNbO_3$ is shown in FIG. 8.

Figure 9:
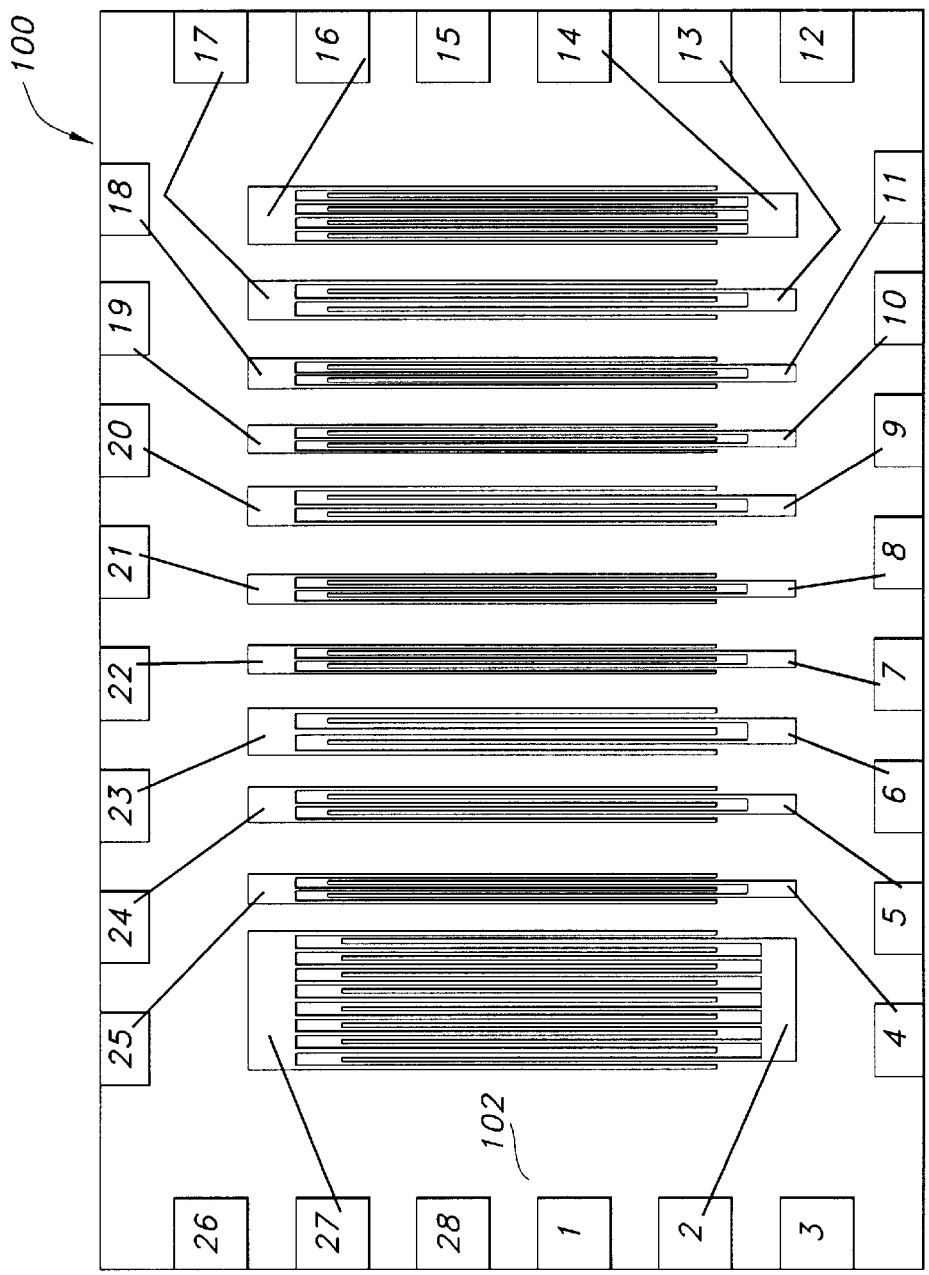
FIG. 9 is a schematic layout of the packaged programmable SAW filter.

The size of the unpackaged programmable SAW filter is 2.6 mm by 2.0 mm. The layout of the packaged SAW filter 100 is shown in FIG. 9. Individual die was separated from the wafer and housed in a 28 lead flat package. The devices are then wire bonded and packaged in the ceramic dual in line DIP-28 package 102. IDT 0 to IDT 10 are interconnected by gold wires from device contact pads to package leads. In order to get a good bonding yield, the size of the bonding pad should be big enough to make sure the good wire connection between the bonding pads and IDTs. In addition, thicker metal deposition is preferred to ensure the connection between bonding pads and gold.

Figure 10:
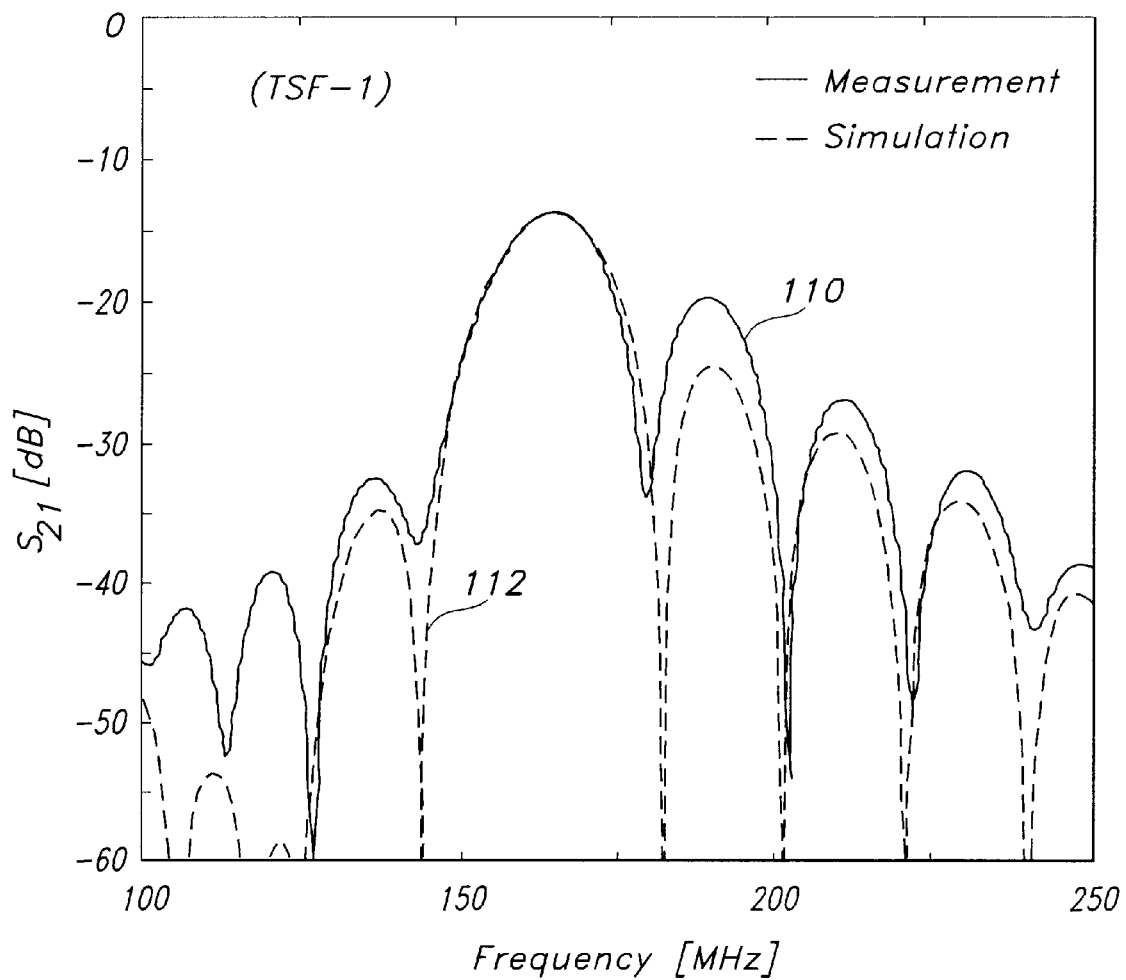
FIG. 10 is a diagram showing measured and simulated frequency responses of a single IDT SAW filter.

The present invention SAW filter design offers two basic types of tunable SAW filters: single IDT input and multi-IDT input configurations. In the first single IDT input configuration, IDTs 1 and 0 are the input and output IDTs, respectively. The measured and simulated frequency responses of this configuration are shown in FIG. 10, where the solid line 110 represents measurement, and the dashed line 112 represents simulation results, respectively. The measured center frequency is at 165.2 MHz while the simulated one is at 165.1 MHz. The measured minimum insertion loss is 13.7 dB. For 3 dB bandwidth, the measurement gives the value of 15.2 MHz comparing to the simulation which give the value of 16.0 MHz.

In the single IDT input configuration, one of eleven IDTs is chosen as an input and another one as an output IDT to form a SAW filter. With the current design of 11 transducers in one programmable SAW filter, 55 different single-IDT input SAW filter configurations can be obtained. Although some of these configurations have input and output IDTs with the same structure, the distances between the input and output transducers are different. Therefore, in terms of frequency response, their phase responses will be different in spite of the same magnitude response.

In the multi-IDT input configuration, two or more IDTs are chosen as inputs and another IDT as an output. In the second single IDT input configuration, IDT 8 and 10 are the input and output IDTs, respectively. The measured center frequency is at 166.0 MHz while the simulated one is at 164.5 MHz. The measured minimum insertion loss is 17.1 dB. The measured and simulated 3 dB bandwidth are 29.0 MHz and 32.5 MHz, respectively. The discrepancy between the measured and simulated value of 3 dB bandwidth is mainly caused by the reflected surface waves from the nonactivated IDTs. These reflected waves add up with the main surface wave when they reach the output IDTs. While the reflected waves do not change the center frequency significantly, they do affect the 3 dB bandwidth of the SAW filter.

Figure 11:
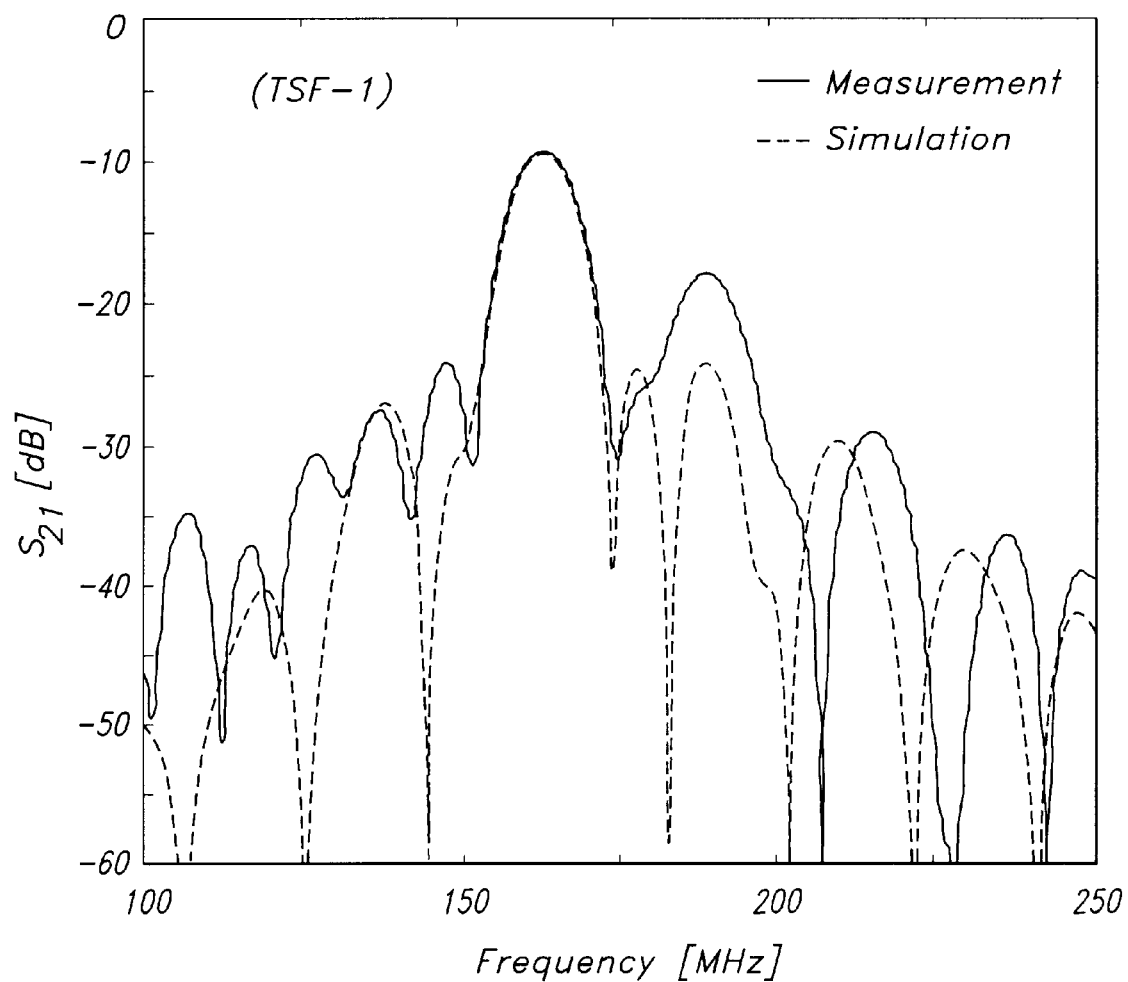
FIG. 11 is a diagram of frequency responses of a multi-IDT SAW filter.

FIG. 11 shows frequency responses of a multi-IDT input SAW filter configuration, in which IDTs 1 and 2 are the inputs and IDT 0 is the output. The measured and simulated center frequencies are 163.3 MHz and 163.6 MHz, respectively. The measured 3 dB bandwidth is 10.0 MHz while the simulated one is 9.7 MHz. The measured minimum insertion loss of this SAW filter configuration is 9.6 dB.

It is noted that the multi-IDT input configuration shows smaller insertion loss than that of the single IDT input counterpart. This is mainly due to constructive wave interference and better impedance matching. In the multi-input configuration, two or more surface acoustic waves travelling along the substrate surface with different wavelength are excited. When the surface waves reach the output IDT, they induce a potential difference between neighboring electrodes. The constructive interference of two surface waves depends on the center frequencies of two input transducers and the distances between the two input and output transducers. These parameters are carefully designed so that the surface waves add constructively near the center frequency of the resulting filter.

One option available for the multi-IDT configurations is to use impedance weighting to control the relative excitation applied to the various IDTs. This provides an additional degree of freedom with which to influence the transfer function of the filter. In theory, an arbitrary impedance element (inductor, capacitor, or resistor) can be used to provide the weighting. In evaluating this technique as applied to the prototype filter, resistors were chosen as the impedance elements as the resistance weighting method can be quickly and easily implemented.

Figure 12:
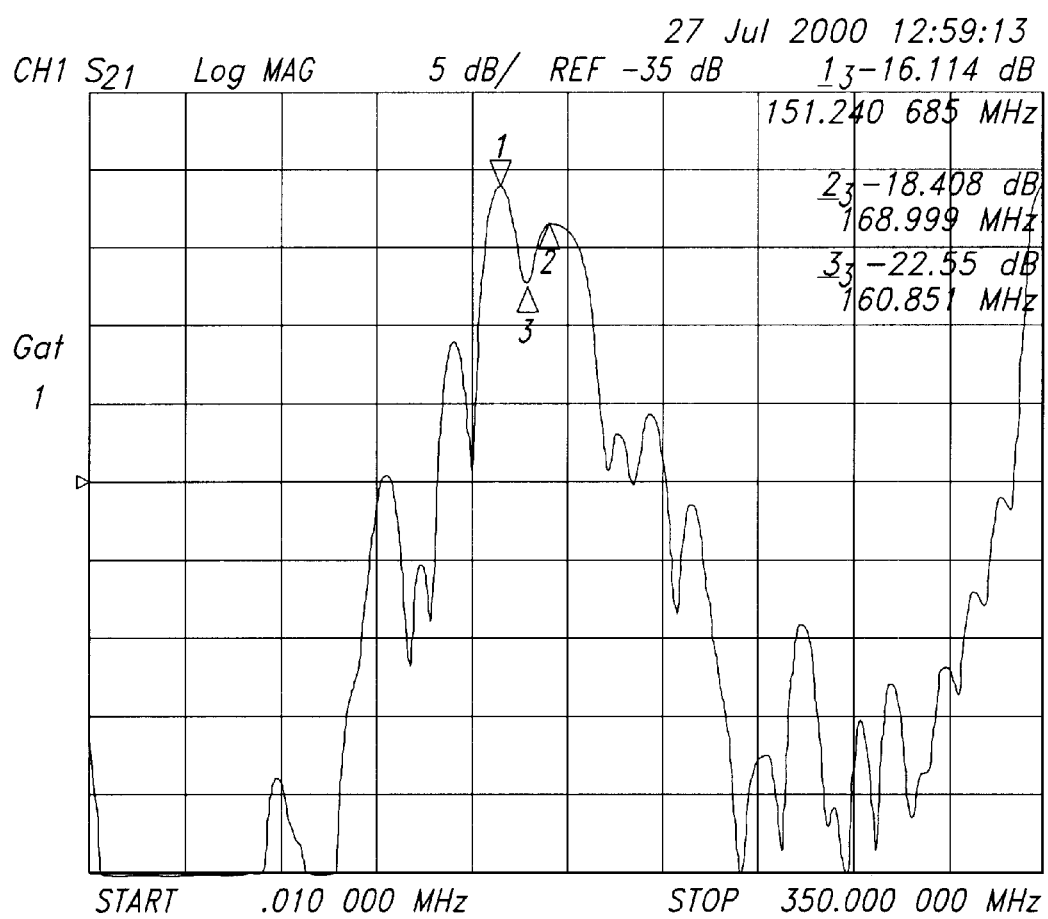
FIG. 12 is a diagram of the frequency response of a multi-IDT SAW filter, in which IDTs 8 and 9 serve as input transducers and IDT 10 serves as the output transducer, without resistance weighting.
Figure 13:
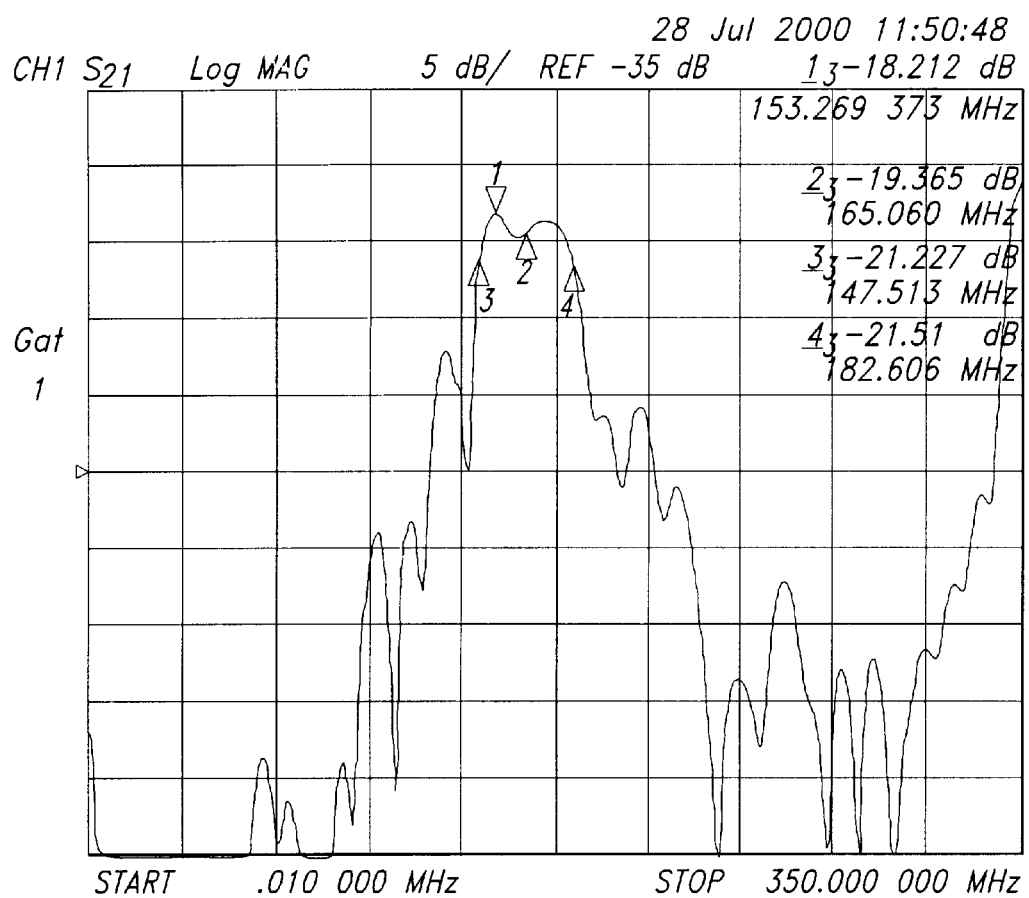
FIG. 13 is a diagram of the frequency response of the multi-IDT SAW filter of FIG. 12 with resistance weighting using a 618$\Omega$ resistor connected in series with IDT9.

With properly chosen values for the resistors, this method can improve the frequency response of the SAW filter. FIG. 12 shows the measured frequency response of the SAW filter where IDTs 8 and 9 are the input transducers and IDT 10 is the output transducer. There are two closely placed passbands whose center frequencies are at 151.24 MHz and 168.99 MHz, respectively. The passband ripple caused by the two bands is about 6.44 dB. Such high passband ripple is unacceptable in many filter applications. A resistor of 618$\Omega$ was connected in series with IDT 9 for the same filter configuration and the measured frequency response is shown in FIG. 13. With the resistor connected with IDT 9, the weighting factors are changed and IDT 8 contributes more to the overall transfer function. After resistance weighting, the passband ripple was reduced from 6.44 dB to only 1.37 dB. The minimum insertion loss at the center frequency is 18.2 dB and the 3 dB bandwidth is 34.8 MHz. For a SAW filter with a 22% fractional bandwidth, it is difficult to achieve such small passband ripple with conventional SAW filter design methods.

It should be noted that after resistance weighting the minimum insertion loss was increased by 3.1 dB. The reason for this is because part of the energy activated by IDT 9 is consumed in the resistor. Therefore, there is a trade-off between insertion loss and passband ripple in applying resistance weighting.

The present invention programmable SAW filter design possesses single IDT and multi-IDT input configurations, which offer more tunability of center frequency and bandwidth. The center frequencies of the SAW filter range from 126.8 MHz to 199.1 MHz while the 3 dB bandwidth range from 18.8 MHz to 58.9 MHz. The changes between different SAW filter configurations are implemented by RF switches and controlled by a computer. A resistance weighting method has been applied to adjust the weighting factors of the IDTs in the multi-input filter configuration. With the resistance weighting technique, a passband ripple has been reduced from 6.44 dB to 1.37 dB. This device simplifies the structure and processing by eliminating complex tap-weighting and summing circuits, resulting in smaller and simpler tunable SAW filter with lower insertion loss.

The programmable SAW filter of the present invention may be implemented in a variety of applications. Wideband radar and other communication systems that employ adaptive filter techniques are the main areas of application of programmable SAW filters, especially if they can be programmed at rates comparable with those used in digital signal processing. In spread spectrum communication systems, for instance, the programmable SAW filter can operate as an adaptive pre-filter to remove interference. In the variable waveform radar systems, a programmable SAW filter in the transmitter serves as the programmable pulse compressor. Frequency hopping is another important application for programmable SAW filter.

The present invention programmable SAW filter presents a novel approach to the problems of increasing security and reducing interference effects, and is applicable to both radar and communication systems. In its basic form, the transmitter simply makes occasional changes of the wave form center frequency, according to a pre-arranged pattern known to the receiver. The advantage of using surface acoustic wave method to realize frequency hopping is that a very large number of different frequencies can be easily obtained. Furthermore, in a communication system, frequency hopping is most effective when there are many hops within each data digit, and this requires the frequency changes to be made rapidly and phase coherence to be maintained over many hops. Programmable SAW filters are also widely used in radar jammers and many other military applications.

Various changes to the foregoing described and shown methods and corresponding structures would now be evident to those skilled in the art. The subject matter set forth in the foregoing description and accompanying figures is therefore offered by way of illustration only and not as a limitation. Accordingly, the particularly disclosed scope of the invention is set forth in the following claims.

What is claimed is:

1. A surface acoustic wave device, comprising:
   a piezoelectric substrate;
   an input interdigital transducer deposited on said piezoelectric substrate, wherein said input interdigital transducer transforms an input electric signal into a surface acoustic wave; and
   an output interdigital transducer deposited on said piezoelectric substrate in opposite orientation relative to said input interdigital transducer, wherein said output interdigital transducer transforms said surface acoustic wave resulting from the transformation by said input interdigital transducer into an output electric signal, each of said input and output transducers comprise overlapping electrodes disposed on said piezoelectric substrate, wherein each of said electrodes being of width approximately equal to a quarter wavelength, the wavelength being the wavelength of the surface acoustic wave device and selected ones of said overlapping electrodes being of different widths.

2. A surface acoustic device according to claim 1, wherein said piezoelectric substrate comprising lithium niobate.

3. A surface acoustic wave device according to claim 1, wherein said device comprises eleven constant overlapping interdigital transducers.

4. A surface acoustic device according to claim 3, wherein said device comprises at least one RF switch for switching between different filter configurations by charging the input and output interdigital transducers.

5. A surface acoustic wave device according to claim 3, wherein groups of selected electrodes have widths differing from widths of electrodes of other groups.

6. A surface acoustic wave device according to claim 5, wherein electrodes designated as 1, 4 and 7 each have an electrode width of approximately 5 $\mu$m; electrodes designated as 0, 2, 5 and 10 each have an electrode width of approximately 6 $\mu$m; and electrodes designated as 3, 6 and 9 each have an electrode width of approximately 8 $\mu$m.

7. A surface acoustic wave device according to claim 2, wherein said electrodes are comprised of aluminum.

8. A surface acoustic wave device according to claim 1, wherein said device is housed in a package having conductive leads.

9. A surface acoustic wave device according to claim 8, wherein said package comprises a ceramic dual-in-line package.

10. A surface acoustic wave device according to claim 9, wherein the electrodes are wire bonded conductively to said leads.

11. A surface acoustic wave device, comprising:
    a piezoelectric substrate;
    a plurality of interdigital transducers defined by overlapping electrodes disposed on said piezoelectric substrate, each of said electrodes being of width approximately equal to a quarter wavelength of said surface acoustic wave device, selected ones of said electrodes being of different widths.

12. A surface acoustic wave device according to claim 11, wherein selected ones of said electrodes define an input interdigital transducer and other selected ones of said electrodes define an output interdigital transducer.

13. A surface acoustic wave device, according to claim 12, wherein selected ones of said electrodes define plural input interdigital transducers.

14. A surface acoustic wave device according to claim 12, further comprising RF switches for charging the input and output interdigital transducers.

15. A surface acoustic wave device according to claim 12, wherein said piezoelectric substrate comprises lithium niobate.

16. A surface acoustic wave device according to claim 12, wherein said electrodes define eleven interdigital transducers.

17. A surface acoustic wave device, comprising:

a piezoelectric substrate;

a plurality of interdigital transducers defined by overlapping electrodes disposed on said piezoelectric substrate, each of said electrodes being of width approximately equal to a quarter wavelength of said surface acoustic wave device, selected ones of said electrodes being of different widths, selected ones of said electrodes defining an input interdigital transducer and other selected ones of said electrodes defining an output interdigital transducer, and means connected to one of said input transducers or said output transducers to change the weighting factor of said one transducer.

18. A surface acoustic wave device according to claim 17, wherein said means to change the weighting factor comprises a resistor.

19. A surface acoustic wave device according to claim 18, wherein said resistor is connected in series with said one transducer.

20. A surface device of claim 1 wherein said selected ones of said overlapping electrodes have same aperture length.

* * * * *

UNITED STATES PATENT AND TRADEMARK OFFICE
CERTIFICATE OF CORRECTION

PATENT NO.    : 6,541,893 B2
DATED         : April 1, 2003
INVENTOR(S)   : Zhu et al.

It is certified that error appears in the above-identified patent and that said Letters Patent is hereby corrected as shown below:

<u>Column 1,</u>
Line 39, delete "...network (WLAiN) communications..." and insert -- ...network (WLAN) communications... --.

Signed and Sealed this

Twenty-third Day of September, 2003

JAMES E. ROGAN
*Director of the United States Patent and Trademark Office*